(12) United States Patent
Cariello

(10) Patent No.: US 11,726,685 B2
(45) Date of Patent: *Aug. 15, 2023

(54) RECOVERY OF MEMORY DEVICE FROM A REDUCED POWER STATE

(71) Applicant: Micron Technology, Inc., Boise, ID (US)

(72) Inventor: Giuseppe Cariello, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 29 days.

This patent is subject to a terminal disclaimer.

(21) Appl. No.: 17/466,469

(22) Filed: Sep. 3, 2021

(65) Prior Publication Data

US 2021/0397354 A1 Dec. 23, 2021

Related U.S. Application Data

(63) Continuation of application No. 16/553,407, filed on Aug. 28, 2019, now Pat. No. 11,112,983.

(51) Int. Cl.
| | |
|---|---|
| *G06F 3/06* | (2006.01) |
| *G11C 16/04* | (2006.01) |
| *G11C 16/26* | (2006.01) |
| *G11C 16/30* | (2006.01) |
| *G11C 16/08* | (2006.01) |

(52) U.S. Cl.
CPC ............ *G06F 3/0632* (2013.01); *G06F 3/068* (2013.01); *G06F 3/0617* (2013.01); *G06F 3/0653* (2013.01); *G11C 16/0483* (2013.01); *G11C 16/08* (2013.01); *G11C 16/26* (2013.01); *G11C 16/30* (2013.01)

(58) Field of Classification Search
CPC ...... G06F 3/068; G06F 3/0632; G06F 3/0617; G06F 3/0653; G11C 16/0483; G11C 16/26; G11C 16/08; G11C 16/30
USPC ......................................................... 711/103
See application file for complete search history.

(56) References Cited

U.S. PATENT DOCUMENTS

| | | | |
|---|---|---|---|
| 9,286,985 B2 | 3/2016 | Kimura | |
| 2005/0138447 A1* | 6/2005 | Kobayashi | ......... H04N 1/00896 |
| | | | 713/300 |
| 2016/0132391 A1 | 5/2016 | Thoen | |
| 2021/0064257 A1 | 3/2021 | Cariello | |

* cited by examiner

*Primary Examiner* — Hua J Song
(74) *Attorney, Agent, or Firm* — Schwegman Lundberg & Woessner, P.A.

(57) ABSTRACT

Devices and techniques are disclosed herein to control recovery of a memory device from a reduced power state. A memory controller can include a detection circuit configured to monitor the power supply voltage to an array of memory cells during the reduced power state. Control circuitry an initialization procedure for recovery of the memory device from the reduced power state, based on the state of the detection circuit.

21 Claims, 6 Drawing Sheets

RECOVERY OF MEMORY DEVICE FROM A REDUCED POWER STATE

PRIORITY APPLICATION

This application is a continuation of U.S. application Ser. No. 16/553,407, filed Aug. 28, 2019, which is incorporated herein by reference in its entirety.

Embodiments of the present disclosure relates generally to operation of storage systems in power saving modes; and more specifically relate to methods and apparatus for transitioning a storage system from a power saving mode to an operational mode.

BACKGROUND

Memory devices are semiconductor circuits that provide electronic storage of data for a host device such as form part of a computer or other electronic device. Memory devices may be volatile or non-volatile. Volatile memory requires power to maintain data and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), and 3D-Xpoint memory, among others.

Electronic systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system (e.g., a solid-state drive (SSD), a managed memory device (as an example, a managed NAND memory device)), can include a memory controller and one or more memory devices, including a number of (e.g., multiple) dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

Software (e.g., programs), instructions, operating systems (OS), and data are typically stored on storage systems and accessed by main memory for use by the host processor. Main memory (e.g., RAM) is typically faster, more expensive, and a different type of memory device (e.g., volatile) than a majority of the memory devices of the storage system (e.g., non-volatile, such as an SSD, etc.). In addition to the main memory, host systems can include different levels of volatile memory, such as a group of static memory (e.g., a cache, often SRAM), often faster than the main memory, in certain examples, configured to operate at speeds close to or exceeding the speed of the host processor, but with lower density and higher cost.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
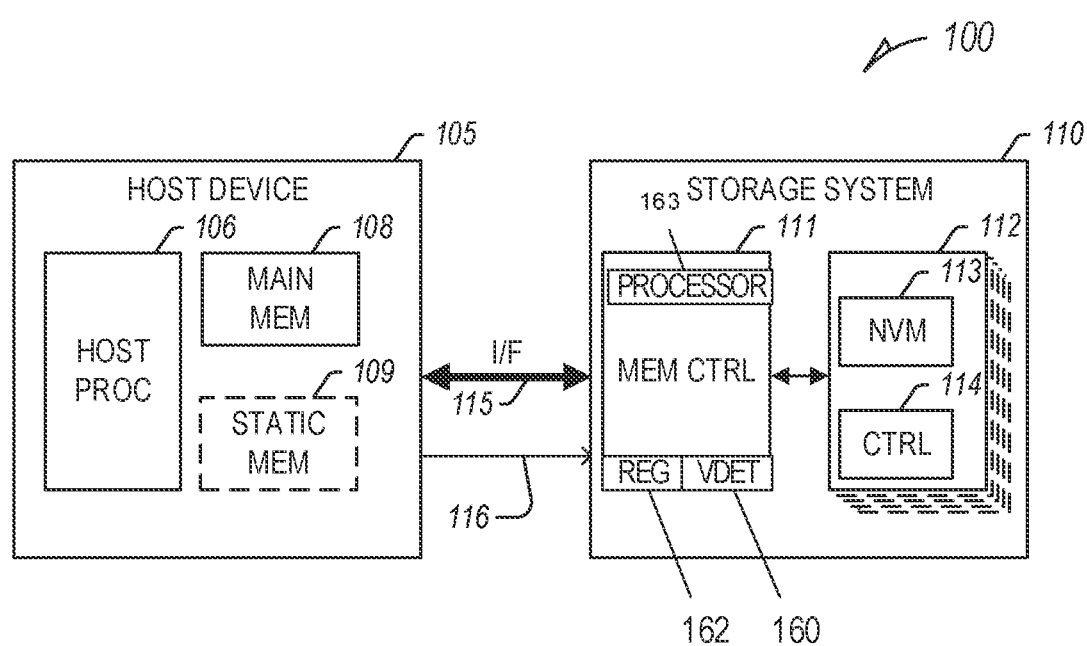
FIG. 1 illustrates an example host system including a host and a storage system.

Modern electronic systems, including a host device, a storage system, and a communication interface, implement multiple power modes in the storage system, including, for example, a normal (e.g., active or operational) mode, one or more levels of reduced power (or "power-saving") modes, which may be implemented on a device in multiple forms, in which each power saving mode will restrict power to one or more portions of the storage system and can exhibit different characteristics in returning to an operational mode. Such power-saving modes are sometimes identified by relative terms, such as a "sleep mode," a "deep sleep mode," a "hibernate mode," and an off mode. During power-saving modes, power usage can be reduced by moving some data to non-volatile memory and then removing the power supply from that non-volatile memory (e.g., prior to the corresponding storage system entering the sleep state).

For example, some systems use tightly-coupled memory (TCM), which is memory that is similar to CPU's cache memory in that TCM and cache memory can both be accessed quickly, typically through a dedicated connection to the processor. However, TCM is configured for relatively faster access by a processor (for example through use of SRAM), and requires less overhead to implement and TCM can be accessed in a more predictable fashion than cache memory because TCM has static content whereas attempts to access cache memory may result in a successful retrieval from the cache (hit) or a data fetch from main memory (miss). In some such systems, data can sometimes be moved to the NAND array for storage.

In these and other systems, a portion of SRAM can be placed in a retention mode (e.g., a mode in which the power supply is lowered, and the SRAM is not accessible). A limited set of instructions (e.g., for example, a firmware function) can be maintained in retention SRAM while powering down the rest of SRAM and be used, on resume to active mode, to recover other SRAM information from the NAND. However, recovery from power-saving modes can be time-consuming because of the time needed to re-initialize NAND and to reload firmware images and data, among other processes. This can result in deterioration of user experience.

The present inventors have recognized, among other things, that power may remain available to at least a portion of memory even while a host device is in a sleep mode. For example, in some platforms and devices, particularly low-cost devices having a simplified architecture, power rails may be shared by different components of a device and therefore power can remain available to some portions of memory. Power can also remain available to portions of memory for other reasons, for example as part of a conscious trade-off between wake-up latency and power savings. Accordingly, systems, methods and apparatuses can be developed to detect whether power remained above a threshold during the power-saving (e.g., idle, sleep or deep sleep) period. Whether power remained available during this period can indicate whether recovery can be performed using a reduced initiation process, or whether a more complete initiation process must be performed.

Memory devices include individual memory die, which may, for example, include a storage region comprising one or more arrays of memory cells, implementing one (or more) selected storage technologies. Such memory die will often include support circuitry for operating the memory array(s). Other examples, sometimes known generally as "managed memory devices," include assemblies of one or more memory die associated with controller functionality configured to control operation of the one or more memory die. Such controller functionality can simplify interoperability with an external device, such as a "host" as discussed later herein. In such managed memory devices the controller functionality may be implemented on one or more die also incorporating a memory array, or on a separate die). In other examples, one or more memory devices may be combined with controller functionality to form a solid-stage drive (SSD) storage volume. The term "storage system," is used herein as inclusive alone or more memory die, and any controller functionality for such memory die, when present; and thus includes individual memory devices, managed memory devices, and SSDs.

Embodiments of the present disclosure are described in the example of managed memory devices implementing NAND flash memory cells, termed "managed NAND" devices. These examples, however, are not limiting on the scope of the disclosure, which may be implemented in other forms of memory devices and/or with other forms of storage technology.

Both NOR and NAND flash architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell(s) that can store more than one bit of data per cell (i.e., that can represent more than two programmed states).

Managed memory devices may be configured and operated in accordance with recognized industry standards. For example, managed NAND devices may be (as non-limiting examples), a Universal Flash Storage (UFS™) device, or an embedded MMC device (eMMC™), etc. For example, in the case of the above examples, UFS devices may be configured in accordance with Joint Electron Device Engineering Council (JEDEC) standards standard JESD223D, entitled "JEDEC UFS Flash Storage 3.0," and/or updates or subsequent versions to such standard. Similarly, identified eMMC devices may be configured in accordance with JEDEC standard JESD84-A51, again, and/or updates or subsequent versions to such standard.

An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact. Managed NAND devices can be used as primary or ancillary memory in various forms of electronic devices, and are commonly used in mobile devices.

Both SSDs and managed memory devices can include a number of memory devices, including a number of dies or logical units (e.g., logical unit numbers or LUNs), and can include one or more processors or other controllers performing logic functions required to operate the memory devices or interface with external systems. Such SSDs and managed memory devices can include one or more flash memory die, including a number of memory arrays and peripheral circuitry thereon. The flash memory arrays can include a number of blocks of memory cells organized into a number of physical pages. In some examples, the SSDs can also include DRAM or SRAM (or other forms of memory die or other memory structures). Similarly, managed NAND devices can include one or more arrays of volatile and/or nonvolatile memory separate from the NAND storage array, and either within or separate from a controller. Both SSDs and managed NAND devices can receive commands from a host in association with memory operations, such as read or write operations to transfer data (e.g., user data and associated integrity data, such as error data and address data, etc.) between the memory devices and the host, or erase operations to erase data from the memory devices.

For purposes of the present description, the present methods and structures may be described in an example implementation of managed NAND devices, such as may be constructed and operated generally in accordance with the described JEDEC UFS Flash Storage 3.0 specification (as may be modified to incorporate the structures and functionality described herein. However, this implementation, and the described functionality may be implemented with other types of memory devices, as described above, which may incorporate other storage technologies, a few non-limiting examples of which were discussed earlier herein FIG. 1 illustrates an example system (e.g., a host system) 100 including a host device 105 and a storage system 110 configured to communicate over a communication interface (I/F) 115 (e.g., a bidirectional parallel or serial communication interface). In an example, the communication interface 115 can be referred to as a host interface. The host device 105 can include a host processor 106 (e.g., a host central processing unit (CPU) or other processor or processing device) or other host circuitry (e.g., a memory management unit (MMU), interface circuitry, etc.). In certain examples, the host device 105 can include a main memory (MAIN MEM) 108 (e.g., DRAM, etc.) and optionally, a static memory (STATIC MEM) 109, to support operation of the host processor (HOST PROC) 106.

The storage system 110 can include a universal flash storage (UFS) device, an embedded MMC (eMMC™) device, or one or more other memory devices. For example, if the storage system 110 includes a UFS device, the communication interface 115 can include a serial bidirectional interface, such as defined in one JEDEC standard D223D. In another example, if the storage system 110 includes an eMMC device, the communication interface 115 can include a number of parallel bidirectional data lines (e.g., DAT[7:0]) and one or more command lines, such as defined in one or more JEDEC standards such as JEDEC standard D84-B51. In other examples, the storage system 110 can include one or more other memory devices, or the communication interface 115 can include one or more other interfaces, depending on the host device 105 and the storage system 110.

The storage system 110 can include a memory controller (MEM CTRL) 111 and a non-volatile memory device 112. In an example, the non-volatile memory device 112 can include a number of non-volatile memory devices (e.g., dies or LUNs), such as one or more stacked flash memory devices (e.g., as illustrated with the stacked dashes underneath the non-volatile memory device 112), etc., each including non-volatile memory (NVM) 113 (e.g., one or more groups of non-volatile memory cells) and a device controller (CTRL) 114 or other periphery circuitry thereon (e.g., device logic, etc.), and controlled by the memory controller 111 over an internal storage-system communication interface (e.g., an Open NAND Flash Interface (ONFI) bus, etc.) separate from the communication interface 115. The UFS device can further include a unidirectional reset interface (RST) 116, such as a hardware reset signal interface from the host device 105 to the storage system 110.

Flash memory devices typically include one or more groups of one-transistor, floating gate (FG) or charge trap (CT) memory cells. Two common types of flash memory array architectures include NAND and NOR architectures. The memory cells of the memory array are typically arranged in a matrix. The gates of each memory cell in a row of the array are coupled to an access line (e.g., a word line). In NOR architecture, the drains of each memory cell in a column of the array are coupled to a data line (e.g., a bit line). In NAND architecture, the drains of each memory cell in a column of the array are coupled together in series, source to drain, between a source line and a bit line.

The storage system 110 can include a multimedia card (MMC) solid-state storage device (e.g., micro secure digital (SD) cards, etc.). MMC devices include a number of parallel interfaces (e.g., an 8-bit parallel interface) with a host device 105 and are often removable and separate components from the host device. In contrast, embedded MMC (eMMC) devices are attached to a circuit board and considered a component of the host device, with read speeds that rival serial ATA (SATA) based SSD devices. As demand for mobile device performance continues to increase, such as to fully enable virtual or augmented-reality devices, utilize increasing networks speeds, etc., storage systems have shifted from parallel to serial communication interfaces between the storage system and a host device. UFS devices, including controllers and firmware, communicate with a host device using a low-voltage differential signaling (LVDS) serial interface with dedicated read/write paths, further advancing read/write speeds between a host device and a storage system.

In three-dimensional (3D) architecture semiconductor memory device technology, vertical floating gate (FG) or charge trap (CT) storage structures can be stacked, increasing the number of tiers, physical pages, and accordingly, the density of memory cells in a memory device. Data is often stored arbitrarily on the storage system as small units. Even if accessed as a single unit, data can be received in small, random 4-16 k single file reads (e.g., 60%-80% of operations are smaller than 16 k). It is difficult for a user and even kernel applications to indicate that data should be stored as one sequential cohesive unit. File systems are typically designed to optimize space usage, and not sequential retrieval space.

Figure 4:
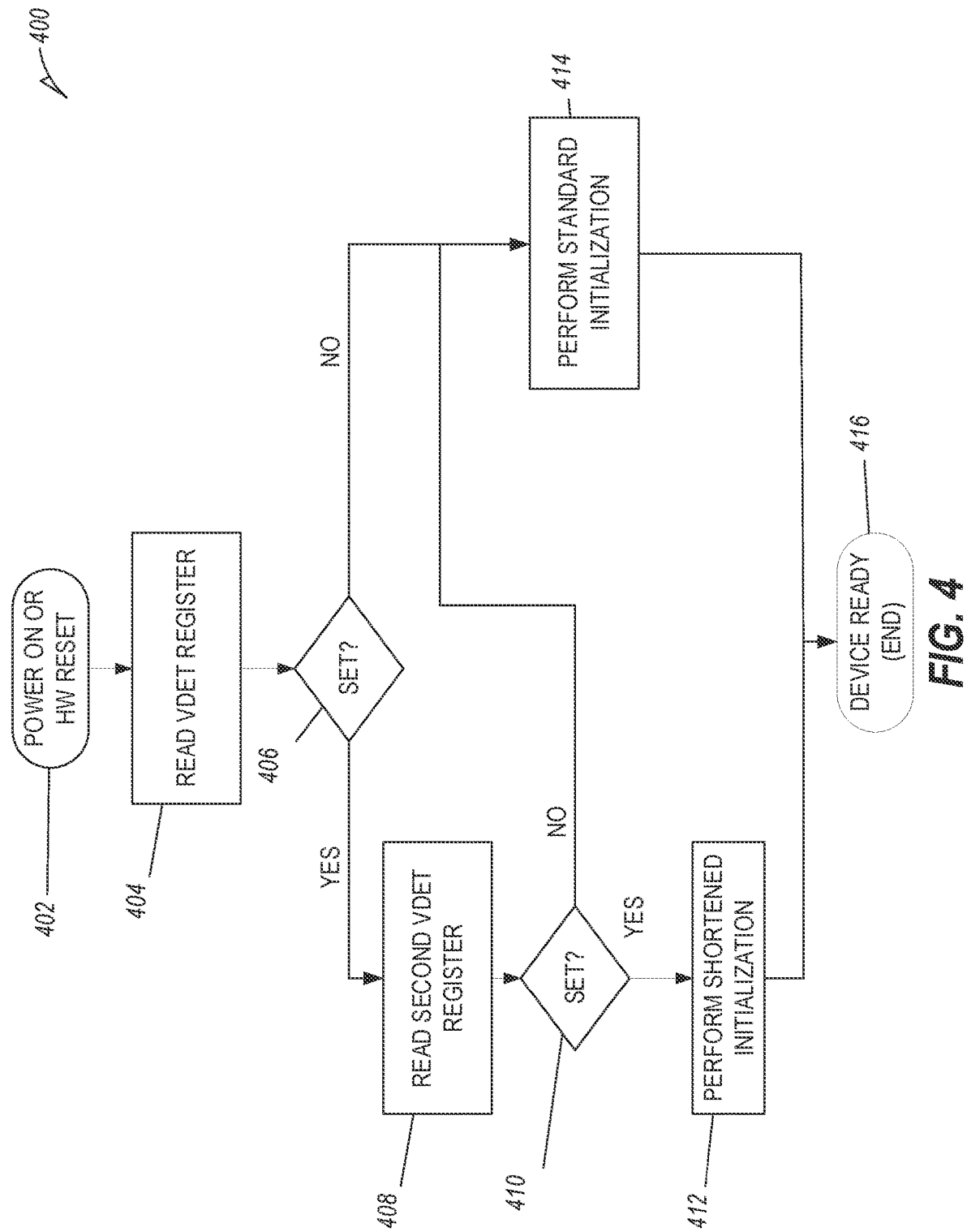
FIG. 4 illustrates generally an example method for resuming memory device operations upon recovery from a sleep mode.

The memory controller 111 can receive instructions from the host device 105, and can communicate with the non-volatile memory device 112, such as to transfer data to (e.g., write or erase) or from (e.g., read) one or more of the memory cells of the non-volatile memory device 112. The memory controller 111 is configured (e.g., through hardware and/or software implementation) to perform the initialization methods described herein, including the exemplary method described below with reference to FIG. 4. For example, the memory controller 111 stores instructions for performing the initialization methods described herein. The memory controller 111 can also include circuitry (e.g., voltage drop detection circuit (Vdet) 160) that can detect when supply power to the memory non-volatile memory device 112 drops below a threshold. For example, the Vdet 160 can monitor power supply voltages to the memory during a sleep state of the storage system 110 as described later herein. Hardware register/s 162 can store data that indicates one or more states of Vdet 160. The memory controller 111 can also include a processor 163 responsive to instructions retained in the storage system 110 which, when executed by the processor 163, cause the processor 163 to perform operations comprising performing an initialization procedure (e.g., as illustrated in FIG. 4) of the storage system 110 to recover from a reduced power state, dependent at least in part on the monitored power supply voltage (e.g., as monitored by Vdet 160).

The non-volatile memory device 112 or the non-volatile memory 113 (e.g., one or more 3D NAND architecture semiconductor memory arrays) can include a number of memory cells arranged in, for example, a number of devices, planes, blocks, physical pages, super blocks, or super pages. As one example, a TLC memory device can include 18,592 bytes (B) of data per page, 1536 pages per block, 548 blocks per plane, and 4 planes per device.

In operation, in the example of NAND-based storage, data is typically written to or read from the storage system 110 in "pages" and erased in "blocks." However, one or more memory operations (e.g., read, write, erase, etc.) can be performed on larger or smaller groups of memory cells, as desired.

Figure 2:
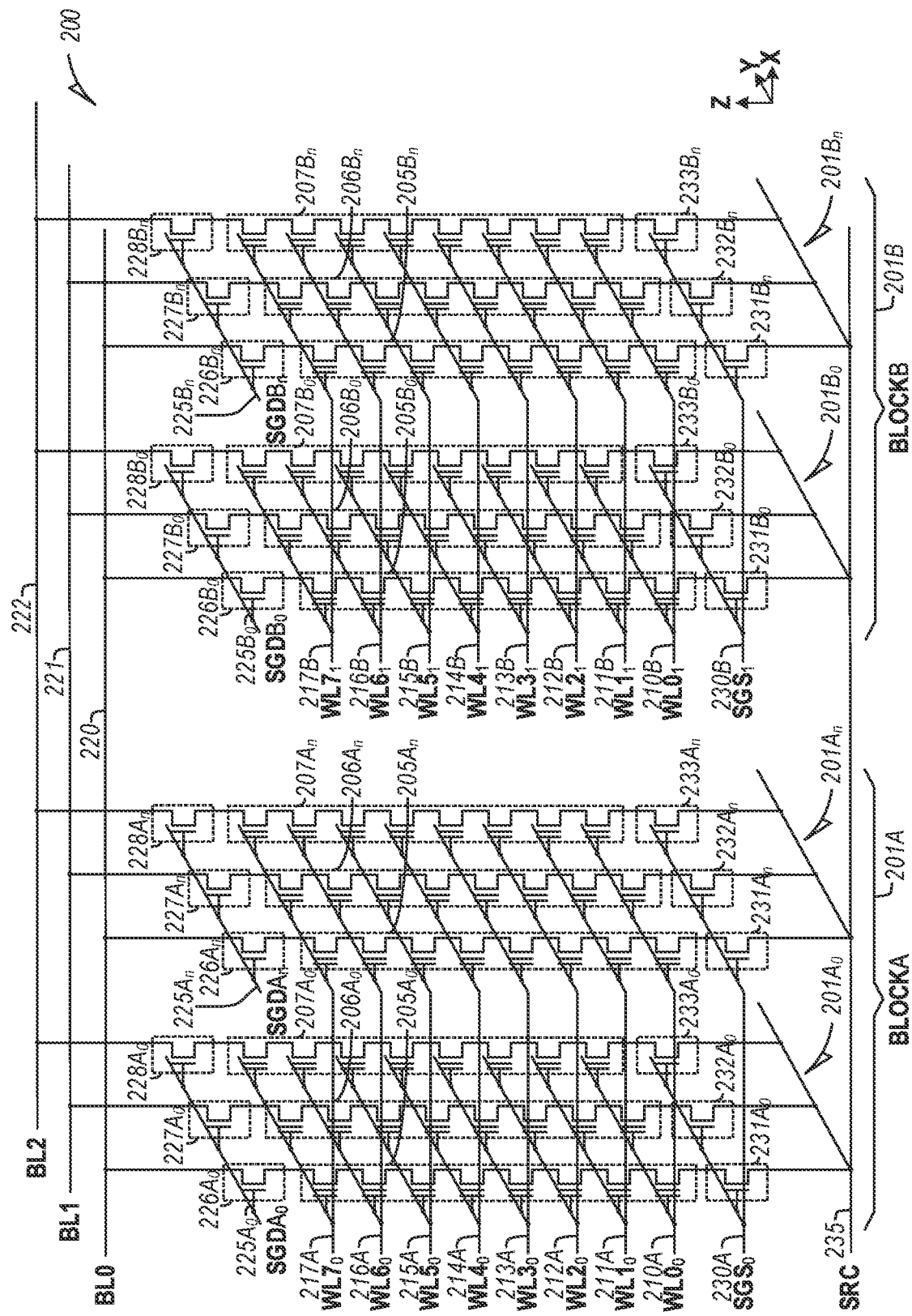
FIG. 2 illustrates an example schematic diagram of a 3D NAND architecture semiconductor memory array.

FIG. 2 illustrates an example schematic diagram of a 3D NAND architecture semiconductor memory array 200 including a number of strings of memory cells (e.g., first-third A0 memory strings 205A0-207A0, first-third An memory strings 205An-207An, first third B0 memory strings 205B0-207B0, first-third Bn memory strings 205Bn-207Bn, etc.), organized in blocks (e.g., block A 201A, block B 201B, etc.) and sub-blocks (e.g., sub-block A0 201A0, sub-block An 201An, sub-block B0 201B0, sub-block Bn 201Bn, etc.). The memory array 200 represents a portion of a greater number of similar structures that would typically be found in a block, device, or other unit of a memory device.

Each string of memory cells includes a number of tiers of storage transistors (e.g., floating gate, charge trapping structures, etc.) stacked in the Z direction, source to drain, between a source line (SRC) 235 or a source-side select gate (SGS) (e.g., first-third A0 SGS 231A0-233A0, first-third An SGS 231An-2233An, first-third B0 SGS 231B0-233B0, first-third Bn SGS 231Bn-233Bn, etc.) and a drain-side select gate (SGD) (e.g., first-third A0 SGD 226A0-228A0, first-third An SGD 226An-228An, first-third B0 SGD 226B0-228B0, first-third Bn SGD 226Bn-228Bn, etc.). Each string of memory cells in the 3D memory array can be arranged along the X direction as data lines (e.g., bit lines (BL) BL0-BL3 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) WL00-WL70 210A-217A, WL01-WL71 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third A0 SGD 226A0-228A0 can be accessed using an A0 SGD line SGDA0 225A0, first-third An SGD 226An-228An can be accessed using an An SGD line SGDAn 225An, first-third B0 SGD 226B0-228B0 can be accessed using a B0 SGD line SGDB0 225B0, and first-third Bn SGD 2268n-2288n can be accessed using a Bn SGD line SGDBn 2258n. First-third A0 SGS 231A0-233A0 and first-third An SGS 231An-233An can be accessed using a gate select line SGS0 230A, and first-third B0 SGS 231B0-233B0 and first-third fan SGS 231Bn-233Bn can be accessed using a gate select line SGS1 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
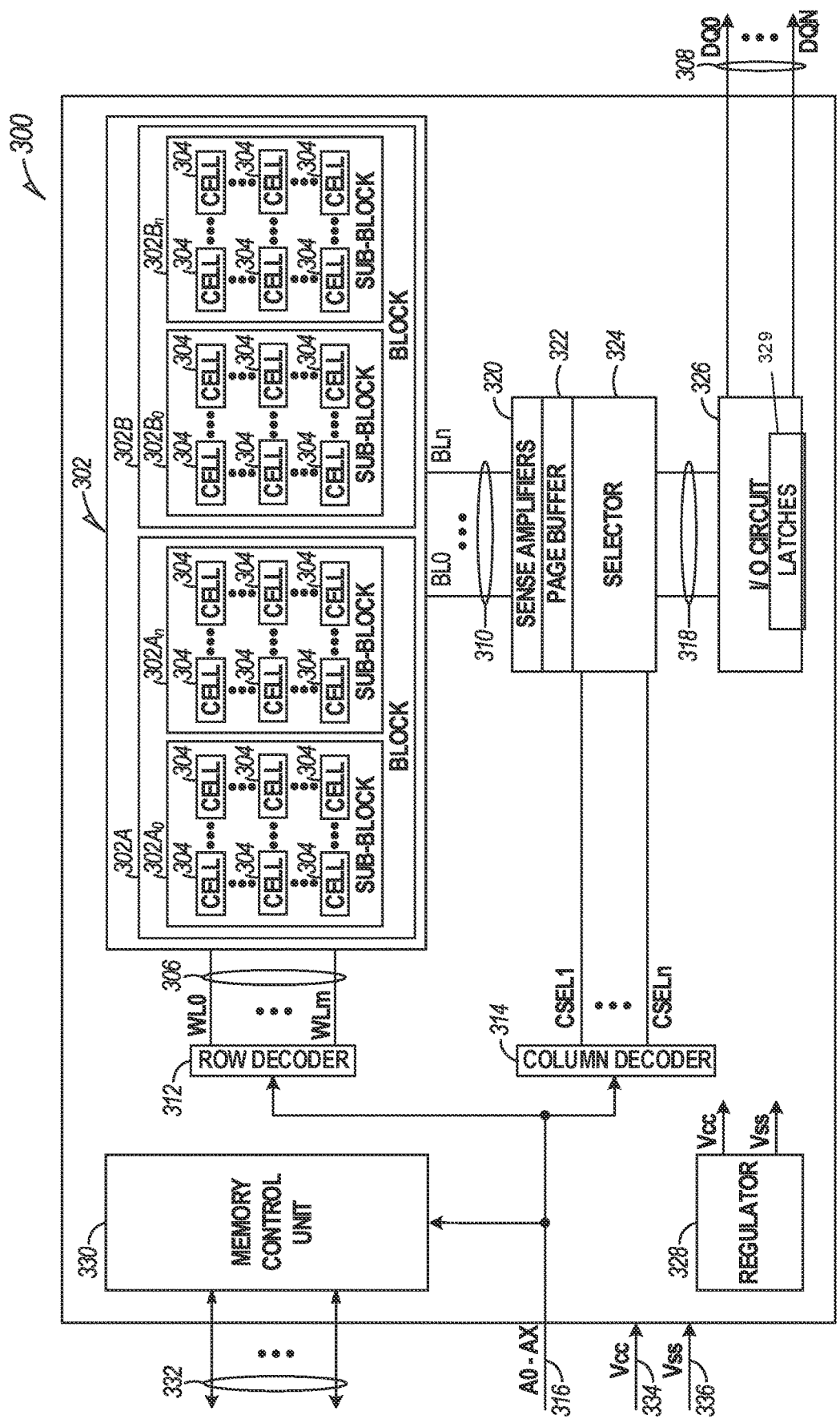
FIG. 3 illustrates an example block diagram of a memory device.

FIG. 3 illustrates an example block diagram of a memory device 300 including a memory array 302 having a plurality of memory cells 304, and one or more circuits or components to provide communication with, or perform one or more memory operations on, the memory array 302. Although shown with a single memory array 302, in other examples, one or more additional memory arrays, dies, or LUNs can be included herein. In certain examples, in a storage system having a number of dies or LUNs, the memory device 300 can represent a block diagram of circuits and components for each die or LUN. The memory device 300 can include a row decoder 312, a column decoder 314, sense amplifiers 320, a page buffer 322, a selector 324, an input/output (I/O) circuit 326, and a memory control unit 330.

The memory cells 304 of the memory array 302 can be arranged in blocks, such as first and second blocks 302A, 302B. Each block can include sub-blocks. For example, the first block 302A can include first and second sub-blocks 302A0, 302An, and the second block 302B can include first and second sub-blocks 302B0, 302Bn. Each sub-block can include a number of physical pages, each page including a number of memory cells 304. Although illustrated herein as having two blocks, each block having two sub-blocks, and each sub-block having a number of memory cells 304, in other examples, the memory array 302 can include more or fewer blocks, sub-blocks, memory cells, etc. In other examples, the memory cells 304 can be arranged in a number of rows, columns, pages, sub-blocks, blocks, etc., and accessed using, for example, access lines 306, first data lines 310, or one or more select gates, source lines, etc.

The memory control unit 330 can control memory operations of the memory device 300 according to one or more signals or instructions received on control lines 332, including, for example, one or more clock signals or control signals that indicate a desired operation (e.g., write, read, erase, etc.), or address signals (A0-AX) received on one or more address lines 316. One or more devices external to the memory device 300 can control the values of the control signals on the control lines 332, or the address signals on the address line 316. Examples of devices external to the memory device 300 can include, but are not limited to, a host, a memory controller, a processor, or one or more circuits or components not illustrated in FIG. 3.

The memory device 300 can use access lines 306 and first data lines 310 to transfer data to (e.g., write or erase) or from (e.g., read) one or more of the memory cells 304. The row decoder 312 and the column decoder 314 can receive and decode the address signals (A0-AX) from the address line 316, can determine which of the memory cells 304 are to be accessed, and can provide signals to one or more of the access lines 306 (e.g., one or more of a plurality of word lines (WL0-WLm)) or the first data lines 310 (e.g., one or more of a plurality of bit lines (BL0-BLn)), such as described above.

The memory device 300 can include sense circuitry, such as the sense amplifiers 320, configured to determine the values of data on (e.g., read), or to determine the values of data to be written to, the memory cells 304 using the first data lines 310. For example, in a selected string of memory cells 304, one or more of the sense amplifiers 320 can read a logic level in the selected memory cell 304 in response to a read current flowing in the memory array 302 through the selected string to the data lines 310.

One or more devices external to the memory device 300 can communicate with the memory device 300 using the I/O lines (DQ0-DQN) 308, address lines 316 (A0-AX), or control lines 332. The input/output (I/O) circuit 326 can transfer values of data in or out of the memory device 300, such as in or out of the page buffer 322 or the memory array 302, using the I/O lines 308, according to, for example, the control lines 332 and address lines 316. The page buffer 322 can store data received from the one or more devices external to the memory device 300 before the data is programmed into relevant portions of the memory array 302, or can store data read from the memory array 302 before the data is transmitted to the one or more devices external to the memory device 300.

The column decoder 314 can receive and decode address signals (A0-AX) into one or more column select signals (CSEL1-CSELn). The selector 324 (e.g., a select circuit) can receive the column select signals (CSEL1-CSELn) and select data in the page buffer 322 representing values of data to be read from or to be programmed into memory cells 304. Selected data can be transferred between the page buffer 322 and the I/O circuit 1226 using second data lines 318.

The memory control unit 330 can receive positive and negative supply signals, such as a supply voltage (Vcc) 334 and a negative supply (Vss) 336 (e.g., a ground potential), from an external source or supply (e.g., an internal or external battery, an AC-to-DC converter, etc.). In certain examples, the memory control unit 330 can include a regulator 328 to internally provide positive or negative supply signals.

The memory device 112 can enter a sleep mode in various circumstances and to varying degrees to save power. As described earlier herein, recovery of a memory device 112 from sleep modes can be time consuming because of the time needed to re-initialize NAND and to reload firmware images and data, among other processes.

FIG. 4 illustrates generally an example method 400 for resuming memory device 112 operations upon recovery from a sleep mode in accordance with some embodiments. Systems, apparatuses and methods according to these and other embodiments can reduce wake-up latency upon recovery from sleep periods. Example method 400 can be performed by elements of a storage system 110 (FIG. 1), such as memory controller 111 (including, for example Vdet circuitry 160). The operations of example method 400 will be discussed in reference to example Vdet circuitry 160 of FIG. 5.

Example method 400 can begin with operation 402 with the storage system 110 receiving a power cycle or hardware reset signal. In some example embodiments, a hardware reset may be received over a HW reset interface 116 (FIG. 1). The example method 400 continues with operation 404 with the memory controller 111 examining registers and data related to Vdet 160 responsive to receiving the HW reset signal (or other power cycle-related signal). As described earlier herein, in some embodiments, a memory controller (e.g., memory controller 111) can include detection circuitry (e.g., Vdet circuitry 160) configured to monitor power supply voltage to the memory device (e.g., to an array of non-volatile memory cells of the memory device 112) during the power-saving period.

Figure 5:
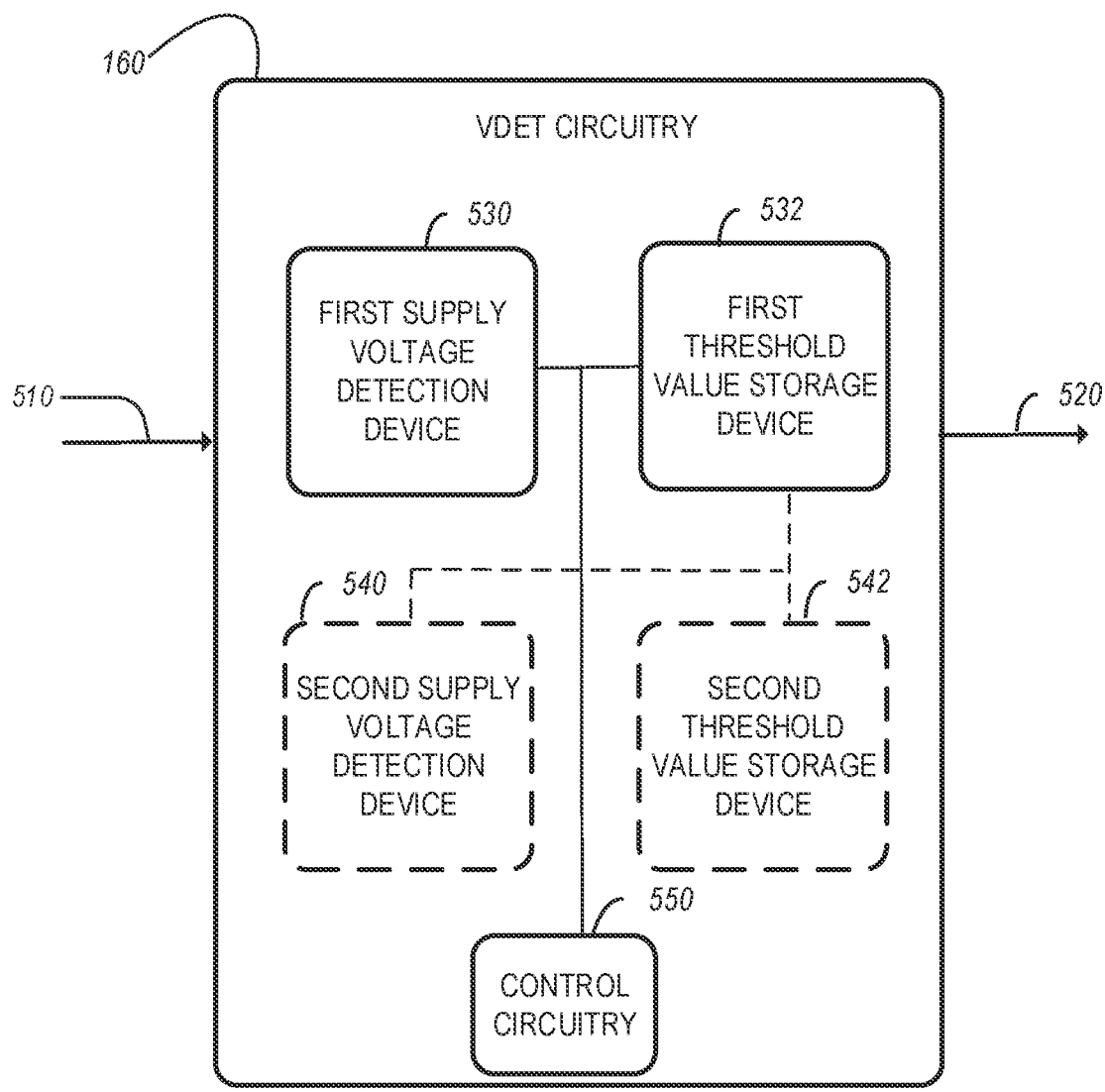
FIG. 5 is a block diagram illustrating an example of a voltage drop detection circuit upon which one or more embodiments may be implemented.

FIG. 5 is a block diagram illustrating an example of Vdet circuitry 160 upon which one or more embodiments may be implemented, such as within the example memory controller 111 of storage system 110. In some embodiments, Vdet circuitry 160, in combination with the remainder of memory controller 111, may be configured to perform a method, such as method 400 of FIG. 4. For example, Vdet circuitry 160 can monitor power supply voltage to the memory (e.g., to an array of non-volatile memory cells of the memory device 112 (FIG. 1)) during a sleep state.

Vdet circuitry 160 includes a first supply voltage detection device 530, a first threshold value storage device 532, control circuitry 550, and may optionally include one or more second supply voltage detection devices 540 (e.g., companion voltage detection device) and second threshold value storage device 542 (as indicated by the dotted lines). First supply voltage detection device 530 may be coupled to an input supply voltage 510. For example, first supply voltage detection device 530 may be coupled to Vcc or Vss output of regulator 328 (FIG. 3) or may be coupled to the power supply of host device 105 (e.g., latches 329 (FIG. 3)). First threshold value storage device 532 may store a current voltage threshold value or a table of voltage threshold values for a given supply voltage device to be monitored. For example, first threshold value storage device 532 may store one supply voltage value for a memory device that operates in one mode and a different second supply voltage value for a memory device that operates in a second mode. Additionally, first threshold value storage device 532 may store in the index different supply voltage values depending on what device of storage system 110 is providing supply voltage 510 (e.g., depending on what supply voltage is being monitored). Control circuitry 550 may detect the current mode of operation of storage system 110, for example.

First supply voltage detection device 530 may include a comparator circuit that compares the input supply voltage 510 to the supply voltage value output by first threshold value storage device 532. In response to determining that the input supply voltage 510 is less than the supply voltage value output by first threshold value storage device 532, first supply voltage detection device 530 may set or clear a flag (e.g., one or more bits of hardware register/s 162 (FIG. 1)). The state of this hardware register 162 can be used as described later herein to help determine whether shortened initialization procedures can be performed or whether a full initialization procedure will be necessary for subsequent operation of the storage system 110.

In some embodiments, one or more additional second supply voltage detection devices 540 may be provided in Vdet circuitry 160 to monitor the supply voltage of one or more second memory devices while first supply voltage detection device 530 monitors the supply voltage of memory device 112. Control circuitry 550 may similarly select for output the threshold voltage(s) from second threshold value storage device 542 depending on the memory device being monitored by second supply voltage detection device 540 for comparison with the supply voltage being input to second supply voltage detection device 540. Similarly, control circuitry 550 may dynamically update the threshold voltage value stored in device 542.

Second supply voltage detection devices 540 may correspond to companion voltage detection devices to first supply voltage detection device 530. In cases where second supply voltage detection devices 540 are companion devices, the voltages monitored by second voltage detection device 540 may be identical to those monitored by first supply voltage detection device 530. As such, the same voltage supply input may be coupled to both the first and second voltage detection devices 530/540.

Referring again to FIG. 4, example method 400 continues with operation 406 with the memory controller 111 determining whether a shortened initialization procedure or standard initialization procedure is to be performed based at least in part on the content/s of the hardware register/s 162. In a first condition, e.g., if the hardware register/s 162 is/are not set, which may indicate that supply voltage to the memory device 112 has not fallen below a certain threshold, the memory controller 111 will read at least a second register at operation 408, to determine, at operation 410, whether shortened initialization procedures are enabled for the particular memory device 112. For example, the second register's may indicate that shortened initialization procedures are enabled if TCM content (including firmware code and data) is available in the NAND page buffers. If shortened initialization procedures are enabled for that particular memory device 112, then the example method 400 continues with operation 412 with performance of these shortened initialization procedures. In some examples, such shortened initialization procedures can include simply copying NAND page buffers to SRAM. In other examples, (e.g., a supply voltage below a threshold, etc.), static memory (e.g., SRAM) of the storage system may need to be reloaded. In other examples, some power domains (e.g., voltage levels, regulators, charge pumps, etc.) disabled during a relatively deeper power-saving mode may need to be powered back on.

Otherwise the standard initialization procedures will commence at block 414. Standard (e.g., traditional or full) reset procedures can include initialization of NAND, finding the boot block, loading and initializing of firmware, etc. Example method 400 finishes with memory device 112 being ready for use, i.e., being fully initialized and able to be accessed from outside the memory device 112, e.g., by host device 105.

Figure 6:
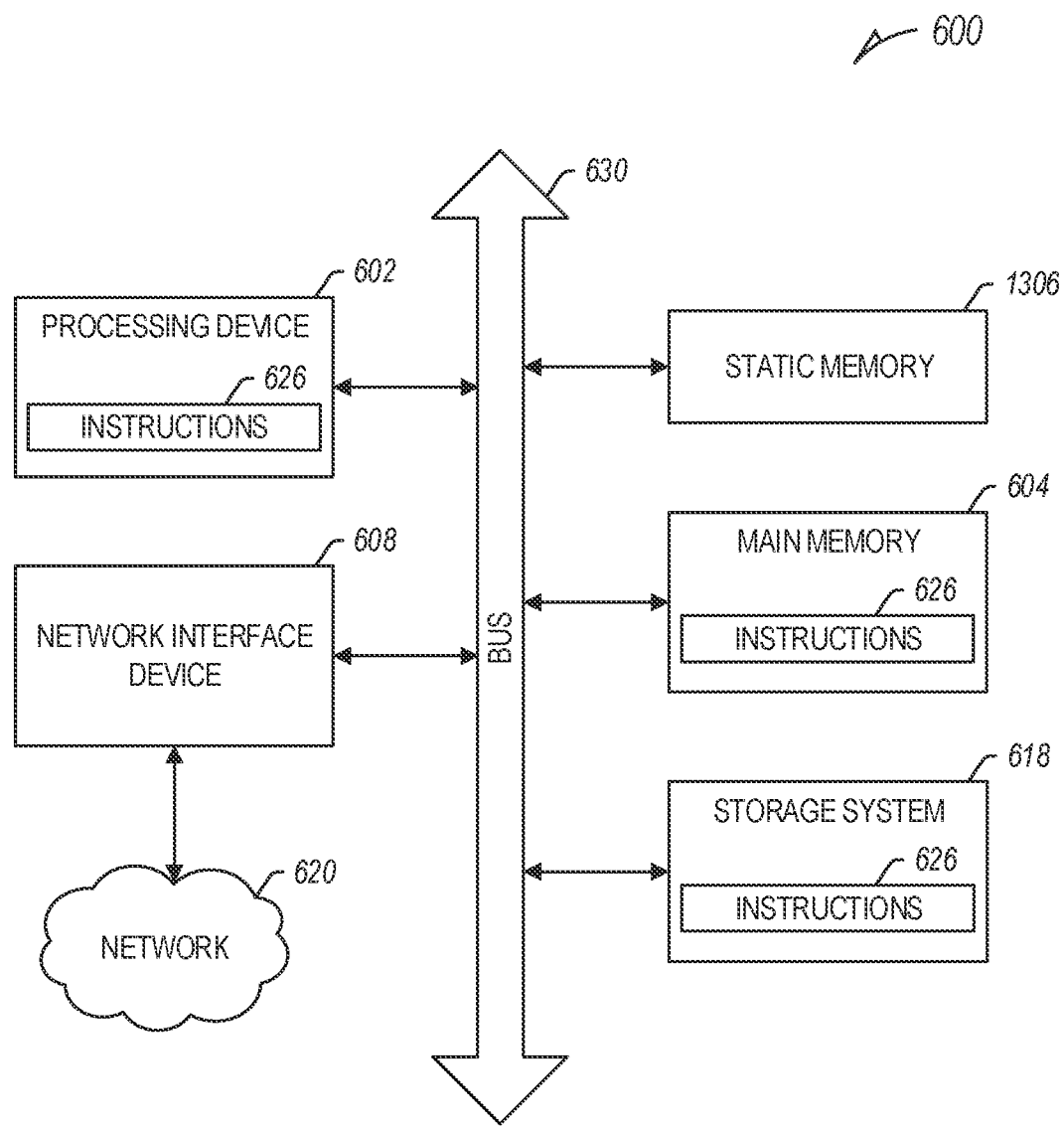
FIG. 6 is a block diagram of an example computer system in which embodiments of the present disclosure may operate.

FIG. 6 illustrates an example machine 600 in the form of a computer system within which a set of instructions can be executed for causing the machine to perform any one or more of the methodologies discussed herein. In alternative embodiments, the machine 600 can correspond to a host system (e.g., the host device 105 of FIG. 1) that includes, is coupled to, or utilizes a memory subsystem (e.g., the storage system 110 of FIG. 1) or can be used to perform the operations described herein (e.g., to perform operations of the memory controller 111 and voltage drop detection circuitry 160 of FIG. 1 for recovery of a memory device from a sleep mode). In alternative embodiments, the machine may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 600 may include a processing device 602 (e.g., a hardware processor, a central processing unit (CPU), a graphics processing unit (GPU), a hardware processor core, or any combination thereof, etc.), a main memory 604 (e.g., read-only memory (ROM), dynamic random-access memory (DRAM) such as synchronous DRAM (SDRAM) or Rambus DRAM (RDRAM), etc.), a static memory 606 (e.g., static random-access memory (SRAM), etc.), and a storage system 618, some or all of which may communicate with each other via a communication interface (e.g., a bus) 630.

The processing device 602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The machine 600 can further include a network interface device 608 to communicate over a network 620.

The storage system 618 can include a machine-readable storage medium (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the machine 600, the main memory 604 and the processing device 602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the storage system 618 can be accessed by the main memory 604 for use by the processing device 602. The main memory 604 (e.g., DRAM) is typically fast, but volatile, and thus a different type of storage than the storage system 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the storage system 618 can be allocated to supplement the main memory 604; however, because the storage system 618 device is typically slower than the main memory 604, and write speeds are typically at least twice as slow as read speeds, use of virtual memory can greatly reduce user experience due to storage system latency (in contrast to the main memory 604, e.g., DRAM). Further, use of the storage system 618 for virtual memory can greatly reduce the usable lifespan of the storage system 618.

The instructions 626 may further be transmitted or received over a network 620 using a transmission medium via the network interface device 608 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B"

includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Example 1 is a storage system comprising: a memory comprised of an array of non-volatile memory cells; and a memory controller including a voltage drop detection circuit to monitor power supply voltage to the memory during a reduced power state of the storage system, and a processor responsive to instructions retained in the storage system, which when executed by the processor cause the processor to perform operations comprising performing an initialization procedure of the storage system to recover from the reduced power state, dependent at least in part on the monitored power supply voltage to the memory during the reduced power state.

In Example 2, the subject matter of Example 1 includes wherein the processor is configured to perform a shortened initialization procedure if the state of the voltage drop detection circuit indicates that power to the memory has not fallen below a threshold voltage.

In Example 3, the subject matter of Example 2 includes wherein the memory controller further includes at least one hardware register to store data that indicates the state of the power supply voltage monitored by the voltage drop detection circuit during the reduced power state relative to a threshold.

In Example 4, the subject matter of Example 3 includes wherein the memory controller includes at least one additional hardware register to store data that indicates whether the shortened initialization procedure is enabled.

In Example 5, the subject matter of Example 4 includes wherein the processor is further configured to read the at least one additional hardware register and to perform a standard initialization procedure if the at least one additional hardware register indicates that the shortened initialization procedure is not enabled.

In Example 6, the subject matter of Examples 2-5 includes wherein the processor is further configured to store at least a portion of tightly-coupled memory (TCM) content in a page buffer of the memory, prior to the memory entering the reduced power state.

In Example 7, the subject matter of Example 6 includes wherein the shortened initialization procedure includes copying at least the portion of TCM content from the page buffer to random access memory (RAM) of the storage system.

In Example 8, the subject matter of Examples 1-7 includes wherein a power supply monitored by the voltage drop detection circuit is shared between the array and at least one other component of the storage system.

In Example 9, the subject matter of Examples 1-8 includes a reset interface to a host device, and wherein the memory controller is configured to perform the initialization procedure responsive to the storage system receiving a hardware (HW) reset signal over the reset interface.

In Example 10, the subject matter of Examples 1-9 incudes wherein the voltage drop detection circuit includes at least two supply voltage detection devices, and wherein a first supply voltage detection device of the at least two supply voltage detection devices is coupled to an input supply voltage for the storage system.

In Example 11, the subject matter of Example 10 includes wherein the voltage drop detection circuit includes a threshold value storage device to store voltage thresholds corresponding to operational modes of the memory.

Example 12 is a method of operating a storage system, the method comprising: monitoring a power supply voltage to a memory device of the storage system during a reduced power state of the storage system; storing data indicative of a state of the monitored power supply voltage within at least one hardware register; reading the data indicative of the state of the monitored power supply voltage relative to a threshold; and controlling an initialization procedure of the storage system to recover from the reduced power state based at least in part on the read data.

In Example 13, the subject matter of Example 12 includes wherein controlling the initialization procedure includes performing a shortened initialization procedure if the data indicative of the state of the power supply voltage indicates that power to the memory device has not fallen below a threshold voltage.

In Example 14, the subject matter of Example 13 includes storing data, in at least one additional hardware register, to indicate whether the shortened initialization procedure is enabled.

In Example 15, the subject matter of Example 14 includes reading the at least one additional hardware register; and performing a standard initialization procedure if the at least one additional hardware register indicates that the shortened initialization procedure is not enabled.

In Example 16, the subject matter of Examples 13-15 include storing at least a portion of tightly-coupled memory (TCM) content in a page buffer of the memory, prior to the memory device entering the reduced power state.

In Example 17, the subject matter of Example 16 includes wherein performing the shortened initialization procedure includes copying at least the portion of TCM content from the page buffer to random access memory (RAM).

Example 18 is an electronic system comprising a device comprising a host processor; a storage system connected to the device through at least a reset interface, the storage system comprising a memory comprised of an array of non-volatile memory cells; and a memory controller configured to perform an initialization procedure of the storage system subsequent to recovery of the storage system from a reduced power state, the memory controller including a voltage drop detection circuit to monitor power supply voltage to the memory during the reduced power state, and to generate an indicator of the monitored voltage; and control circuitry configured to control the initialization procedure based on the monitored voltage indicator of the voltage drop detection circuit.

In Example 19, the subject matter of Example 18 includes wherein the control circuitry is configured to perform one of a shortened initialization procedure or a standard initialization procedure based on the monitored voltage indicator of the voltage drop detection circuit.

In Example 20, the subject matter of Examples 18-19 include wherein the control circuitry is further configured to store at least a portion of tightly-coupled memory (TCM) content in a page buffer of the memory, prior to the storage system entering the reduced power state.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory, comprising:
    a memory array comprising one or more arrays of non-volatile memory cells; and
    a memory controller, comprising,
        a voltage drop detection circuit operable during a reduced power state of the memory; and
        a processor responsive to instructions retained in the memory, which when executed by the processor cause the processor to perform operations, comprising,
            placing an array of non-volatile memory cells into a reduced power state;
            while the array of memory cells are in the reduced power state, through use of the voltage drop detection circuit, monitoring a power supply voltage to the array of memory cells and determining whether the voltage to the array of memory cells drops below a respective threshold voltage;
            performing an initialization procedure to recover the array of memory cells from the reduced power state, comprising,
                determining whether a shortened initialization procedure is enabled; and
                in response to determining that power to the memory array did not drop below the threshold voltage, and that a shortened initialization procedure is enabled, performing a shortened initialization procedure to recover the memory array.

2. The memory of claim 1, wherein the processor is further configured to store at least a portion of tightly-coupled memory (TCM) content in a page buffer of the memory, prior to the memory placing the array of memory cells in the reduced power state.

3. The memory of claim 2, wherein performing the shortened initialization procedure includes copying at least the portion of TCM content from the page buffer to random access memory (RAM) of the memory.

4. The memory of claim 1, wherein a power supply monitored by the voltage drop detection circuit is shared between one or more memory arrays and at least one other component of the memory.

5. The memory of claim 1, further comprising a reset interface to a host device, and wherein the memory controller is configured to perform the initialization procedure responsive to the memory receiving a hardware reset signal over the reset interface.

6. The memory of claim 1, wherein the voltage drop detection circuit comprises at least two supply voltage detection devices, and wherein a first supply voltage detection device of the at least two supply voltage detection devices is coupled to an input supply voltage for the memory.

7. The memory of claim 6, wherein the voltage drop detection circuit further comprises a threshold value storage device to store multiple voltage thresholds corresponding to respective operational modes of the memory.

8. The memory of claim 1, wherein in response to determining that the voltage to the array of memory cells did drop below the respective threshold voltage, performing the initialization procedure comprises performing a standard initialization procedure.

9. A memory, comprising:
    multiple memory arrays of non-volatile memory cells; and
    a memory controller configured to perform memory operations, comprising, monitoring power supply voltage to one or more memory arrays while the memory arrays are in a reduced power state, and storing an indicator of the monitored power supply voltage during the reduced power state;

performing an initialization procedure to recover one or more memory arrays from a reduced power state through reference to a stored indicator of the monitored power supply voltage during the reduced power state, comprising, performing one of a shortened initialization procedure or a standard initialization procedure to recover at least a portion of the one or more memory arrays from a reduced power state, wherein performing the shortened initialization procedure is dependent at least on the stored monitored voltage indicator.

10. The memory of claim 9, wherein the operations further comprise placing one or more memory arrays into a reduced power state.

11. The memory of claim 10, wherein the memory controller is further configured to store at least a portion of tightly-coupled memory (TCM) content comprising selected firmware code and data in a page buffer of the memory, prior to placing the one or more memory arrays in the reduced power state.

12. The memory of claim 11, wherein performing the shortened initialization procedure includes copying at least the portion of TCM content from the page buffer to SRAM of the memory.

13. The memory of claim 9, wherein performing the shortened initialization procedure is further dependent on determining that a shortened initialization procedure is enabled.

14. The memory of claim 9, wherein the memory controller comprises a voltage drop detection circuit, and wherein monitoring of the power supply voltage to one or more memory arrays is performed through use of the voltage drop detection circuit.

15. The memory of claim 14, wherein the voltage drop detection circuit identifies whether the power supply voltage to one or more memory arrays dropped to at least a respective threshold voltage during a reduced power mode.

16. The memory of claim 15, wherein the memory controller is configured to place the one or more memory arrays in a selected reduced power mode of multiple reduced power modes.

17. The memory of claim 16, wherein at least two of the multiple reduced power modes are associated with different threshold voltages.

18. The memory of claim 9, wherein the memory controller comprises at least one processor, and wherein the memory further comprises SRAM memory accessible to the processor of the memory controller.

19. The memory of claim 18, wherein a shortened initialization procedure is enabled in response to selected firmware and data being available in page buffers to one or more arrays of the non-volatile memory cells.

20. The memory of claim 9, further comprising a reset interface to a host device, and wherein the memory controller is configured to perform the initialization procedure responsive to the memory receiving a hardware reset signal over the reset interface.

21. A method, comprising:
storing tightly-coupled memory (TCM) content including firmware code and data in a page buffer of a memory, and subsequently placing one or more arrays of the memory in a reduced power state;

during the reduced power state, monitoring a power supply voltage to one or more memory arrays to determine whether the power supply voltage to the one or more memory arrays drops below a threshold during the reduced power state;

storing an indicator of a state of the monitored power supply voltage during at least one reduced power state within at least one hardware register;

determining whether tightly-coupled memory (TCM) content including firmware code and data was stored in a page buffer of the memory prior to the one or more memory arrays entering the reduced power state, to determine whether a shortened initialization procedure is enabled for the one or more memory arrays recovery from the reduced power state;

reading the stored indicator of the state of the monitored power supply voltage relative to a threshold for the reduced power state; and selecting either a standard or shortened initialization procedure to recover from the reduced power state, the selection based at least in part on the stored indicator of the state of the monitored power supply voltage, and determination of whether the TCM content was stored in a page buffer of the memory prior to the one or more memory arrays entering the reduced power state.

* * * * *